United States Patent [19]
Frederiksen

[11] Patent Number: 5,272,529
[45] Date of Patent: Dec. 21, 1993

[54] ADAPTIVE HIERARCHICAL SUBBAND VECTOR QUANTIZATION ENCODER

[75] Inventor: Jeffrey E. Frederiksen, Arlington Heights, Ill.

[73] Assignee: Northwest Starscan Limited Partnership, Kent, Wash.

[21] Appl. No.: 854,203

[22] Filed: Mar. 20, 1992

[51] Int. Cl.⁵ ............................................. H04N 7/133
[52] U.S. Cl. ..................................... 358/133; 358/13
[58] Field of Search ................... 358/13, 133, 135, 136

[56] References Cited

U.S. PATENT DOCUMENTS

| | | | |
|---|---|---|---|
| 4,851,906 | 7/1989 | Koga | 358/133 |
| 5,073,820 | 12/1991 | Nakagawa | 358/13 |
| 5,157,488 | 10/1992 | Pennebaker | 358/13 |

Primary Examiner—Howard W. Britton

[57] ABSTRACT

A method system for data reduction of digital video signals based on vector quantization of vectors formed from coefficients of a discrete cosine transform of pixel blocks. The coefficients are grouped into subbands and both scalar and vector quantization are used. Vector quantization is implemented either directly on the vectors or on vectors formed from inter-frame differences between the transformed vectors. The vector quantization searching routine is in accordance with the Voronoi regions resulting from an off-line codeword clustering method using a minimum distance criterion.

21 Claims, 6 Drawing Sheets

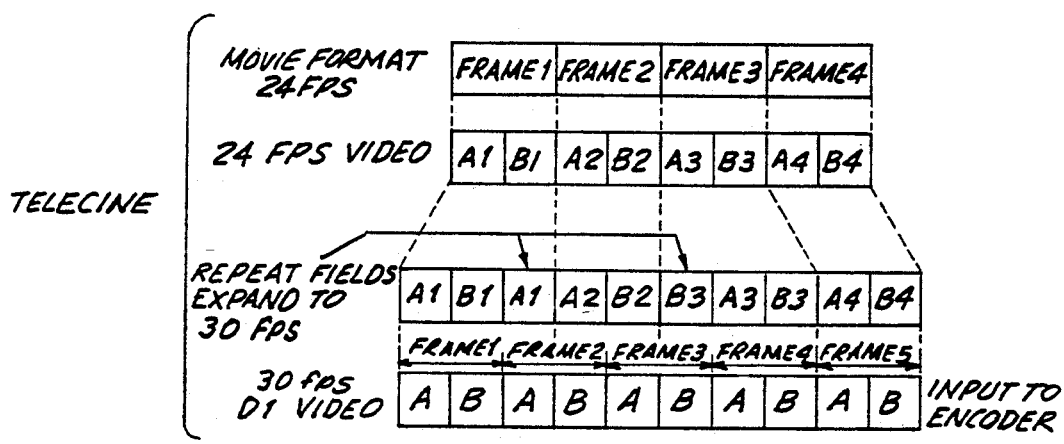
FIG. 4A
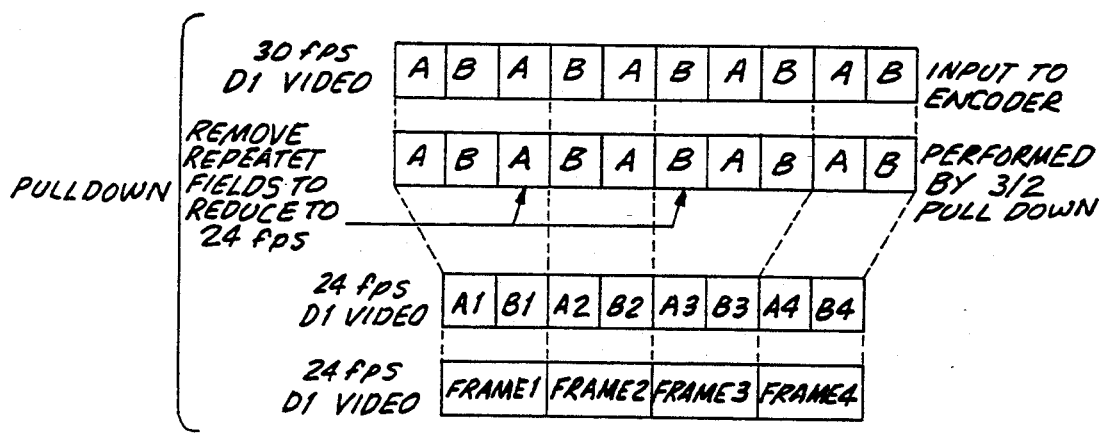
FIG. 4B
| PIXEL ROW | FIRST COLUMN OF PIXEL | SECOND COLUMN OF PIXELS | THIRD COLUMN OF PIXELS | FOURTH COLUMN OF PIXELS |
|---|---|---|---|---|
| n-1 | Cr Y Cb | Y | Cr Y Cb | Y |
| n | Cr Y Cb | Y | Cr Y Cb | Y |
| n+1 | Cr Y Cb | Y | Cr Y Cb | Y |
| n+2 | Cr Y Cb | Y | Cr Y Cb | Y |
FIG. 5

ADAPTIVE HIERARCHICAL SUBBAND VECTOR QUANTIZATION ENCODER

BACKGROUND OF THE INVENTION

The present invention relates generally to signal processing and, more particularly, to a method and an apparatus for data compression based on vector quantization and their application to image coding.

The goal of vector quantization is to reduce the amount of data required to represent an original data set. By those skilled in the art, this data reduction is referred to as data compression or data coding. Data compression reduces transmission data rate and memory storage requirements. In limited bandwidth telecommunications applications, data compression not only eases overall system requirements but also, can be essential for enabling communication of certain kinds of information. For example, transmission of video information over digital communication networks would require bit rates which exceed the capacity of many systems. Thus, effective data compression methods render viable many previously impossible system implementations.

Vector quantization is only one of myriad data compression techniques and has the comparative potential advantage of a greater compression ratio for a given signal integrity loss. Whereas scalar quantization refers to mapping individual samples of a signal, vector quantization groups a plurality of signal sample values, forming a vector. The mapping of this vector into a code possessing fewer bits than the vector is referred to as vector quantization. This mapping is accomplished by comparing the vector with a code book composed of code words which are a representative subset of the set of possible vectors and are each addressed by a code. The code corresponding to the code word which best describes the vector is then used to represent the original signal group. This code is transmitted or stored and recovery of the signal group is accomplished by using the code to access an identical code book. Vector quantization is well suited for compression of video or audio signals since successive signal samples are correlated.

In the application of vector quantization to image data, the digitized values corresponding to an n by m block of pixels is treated as a single vector, where n and m are integers. If each pixel were represented by 8 bits, then 8nm bits would be required to convey the image block information at a data rate corresponding to 8FLP, where F is the frame rate, L is the number of lines per frame, and P is the number of pixels per line. For a typical video signal this data rate would exceed the capacity of established data channels. Conventional vector quantization reduces the data rate by comparing each 8nm bit length vector to a code book containing N representative 8nm-dimensional code word vectors and choosing the most similar vector. The code word index, which has dimension $k=\log_2 N$, results, is used as the data representing an original 8nm-dimensional vector and thus a compression ratio of $r=8nm/k$ results. The essence of the compression is that the $2^{8nm}$ possible combinations for the image block vector can be represented by a reduced set of $2^k$ vectors, requiring k bits to represent a block instead of 8nm bits.

FIG. 1 illustrates the foregoing vector quantization description for a 2×2 pixel block with eight bits per pixel, yielding a 32 bit input vector. The vector code table contains N representative 32 bit vectors which are compared to the input vector according to some distortion measure, and the k bit address (index) to the minimum distortion vector is output by the quantization process. The output vector index could be 16 bits, for example, corresponding to N=64K vector code words in the vector code table, and to a compression ratio of 2:1.

For a given compression ratio r, the code book memory requirements and concomitantly the code book searching computational requirements increases approximately as the product of the input vector bit length and the number of vector codes (eg. $(8nm)2^{8nm/r}$) and thus, the block size, n by m, is generally kept small. Small block sizes, however, result in "blocky" reconstructed images due to edge discontinuities and gray-level discontinuities between adjacent blocks.

Attempts to mitigate the effects of a small block have included using separate codebooks for edge and texture information, statistical correlation among blocks, and orthogonal transformations prior to vector quantization. For example, in U.S. Pat. No. 4,829,376, issued May 9, 1989, Hammer teaches a vector quantization method using an orthonormal transformation with a Hadamard matrix which reduces the "blockiness" and also reduces vector code table searching computational requirements by eliminating multiplication in the search criterion. In addition, improved methods for organizing and searching the codebook have reduced the computational requirements involved in vector quantization such as the method taught by Aldersberg in U.S. Pat. No. 4,907,276, issued Mar. 6, 1990.

Although many approaches have been previously made to vector quantization of image data, this field is still in its infancy and further improvements are required for commercial implementation.

Accordingly, an object of the present invention is to provide a method and system for image coding based on vector quantization which increases the compression ratio.

A specific advantage is that the increased compression ratio allows larger blocks to be encoded for a given code dimension, thereby improving reconstructed image quality.

A further advantage of the present invention is that the increased compression ratio renders digital video transmission practical over diverse transmission media, enabling myriad digital video based systems.

A related advantage is that since the increased compression ratio may result in video output data which does not occupy the full, allotted digital transmission bandwidth, "opportunistic," data may be interjected into the digital video transmission.

The foregoing specific objects and advantages of the invention are illustrative of those which can be achieved by the present invention and are not intended to be exhaustive or limiting of the possible advantages which can be realized. Thus, these and other objects and advantages of the invention will be apparent from the description herein or can be learned from practicing the invention, both as embodied herein or as modified in view of any variations which may be apparent to those skilled in the art.

SUMMARY OF THE INVENTION

The system and method of the present invention provides for increasing the compression ratio of video signals by vector quantization. The method involves taking the discrete cosine transform of the original n by m block, scalar quantizing the DC and two AC components and dividing the remaining coefficients into a midband set, a highband set, and a higher band which is disregarded. The respective midband set and highband set of coefficients are each vector quantized and the composite data stream is composed of these two vector indices and the scalar quantized DC and two AC components.

Enhanced compression is achieved essentially from the discrete cosine transformation which maps the real space image data into the transform space. Since for typical images the predominant information (or energy) is contained within a limited band of the transformation space, fewer components of the transformation space are required to form a vector compared to the number of real space components. For example, for an n by m real space block a vector must be composed of the digital representation of each of the nm total pixels in order for information from each pixel to be coded. The discrete cosine transform of the same n by m pixel block results in a corresponding n by m transformation array; however, part of the transformation array can be disregarded since it possesses limited visually perceptible information. This exploits the same attribute of the human visual system which is sensitive to a "blocky" image: the sensitivity to edge discontinuities. The higher frequency DCT components represent the information for sharp delineation of edges in an image. Since human visual perception is sensitive to edges, a sharp edge need not be defined for its perception and therefore, the high frequency components can be disregarded when forming a vector from the DCT coefficients.

Further compression is gained by several additional adaptive features. A subband is vector quantized only if it contains sufficient information compared to a threshold which is adjusted based on the data rate and capacity of an output buffer. The encoder quantizes spatial frame information or inter-frame, differential information depending on the respective information content. Repeated vectors are skipped and the number and length of vectors in each of a plurality of subbands are monitored and used as an additional means for data reduction. In addition, if necessary for further data reduction, the DC and two AC components are combined into a baseband vector and vector quantized. Standard Huffman coding provides an additional compression factor and is well suited for coding differential frame information.

A novel feature of the inventive encoder is an off-line vector codebook formation method which clusters a set of training vectors into a set of codewords which span the vector space and can be rapidly searched in a hybrid binary/linear routine during the on-line vector quantization coding.

It will be appreciated by those skilled in the art that the foregoing brief description and the following detailed description are exemplary and explanatory of the present invention, but are not intended to be restrictive thereof or limiting of the advantages which can be achieved by the invention. Thus, the accompanying drawings, referred to herein and constituting a part hereof, illustrate preferred embodiments of the invention and, together with the detailed description, serve to explain the principles of the invention.

BRIEF DESCRIPTION OF THE DRAWINGS

The invention will be described in greater detail below by way of reference to the accompanying drawings, wherein:

FIG. 4A schematically depicts the telecine process as known in the art;

FIG. 4B schematically depicts the 3-2 pulldown process according to the present system;

FIG. 5 is a schematic diagram of the pixel luminance and chrominance sampling as known in the art;

DETAILED DESCRIPTION OF THE PREFERRED EMBODIMENT

Figure 1:
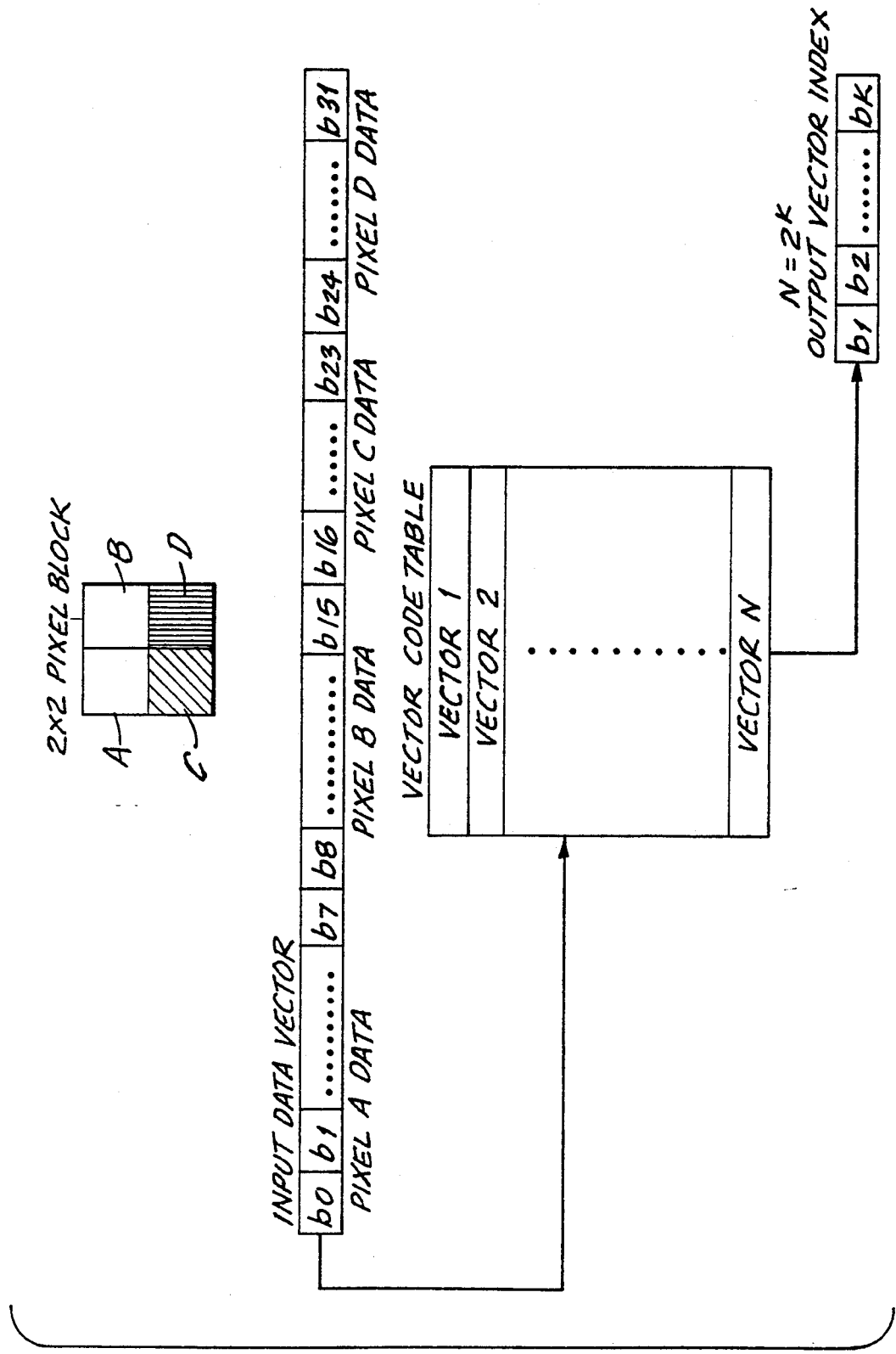
FIG. 1 is a schematic depiction of the vector quantization method, as known in the art, applied to a pixel image.

Referring now to the accompanying drawings, wherein like reference characters refer to like parts throughout the various views, there are shown in FIGS. 1-8 the preferred embodiments of the system and method for video encoding according to the present invention.

Figure 2:
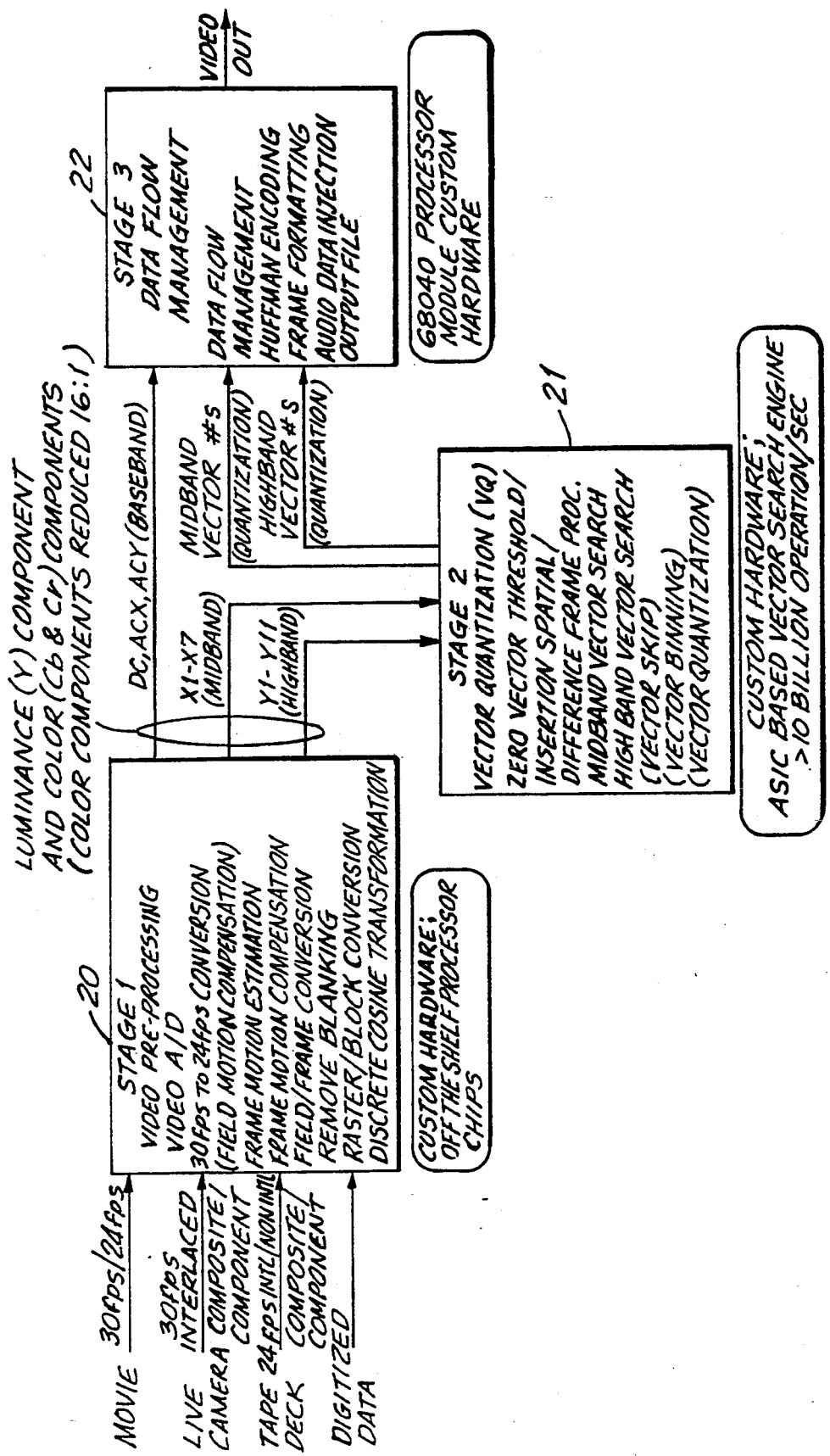
FIG. 2 is a functional block diagram of the video encoder according to the present invention.

The purpose of the video encoder is to take a full bandwidth video signal from one of a variety of sources and compress it into a low data rate signal while maintaining a quality picture on the receiving television system. FIG. 2 depicts a functional block diagram of the preferred video encoder. The encoder is composed of three main sections: the video preprocessor 20, the vector quantizer 21, and the data flow manager 22.

The video preprocessor 20 receives either analog or digital data inputs to the encoder, formats the data as required, performs frame motion estimation and compensation, and performs a discrete cosine transform (DCT) on the data. The DCT output is subdivided into baseband, midband, and highband coefficients.

The vector quantizer 21 takes the midband and highband DCT coefficients and associates the vector (codeword) closest in value to each set of coefficients from a predetermined vector set. The vector quantizer operates in one of two modes: a differential mode where vectors are based on the difference between adjacent frames, and a spatial mode where vectors are based on each separate frame.

The data flow manager 22 regulates the data flow to the output FIFO buffer, increasing or decreasing the data sent from a frame as required to maintain the proper data flow at the FIFO output. The data flow manager 22 also Huffman encodes and formats the output data stream, as well as injects the audio data on a frame-by-frame basis, and controls the output FIFO.

Figure 3:
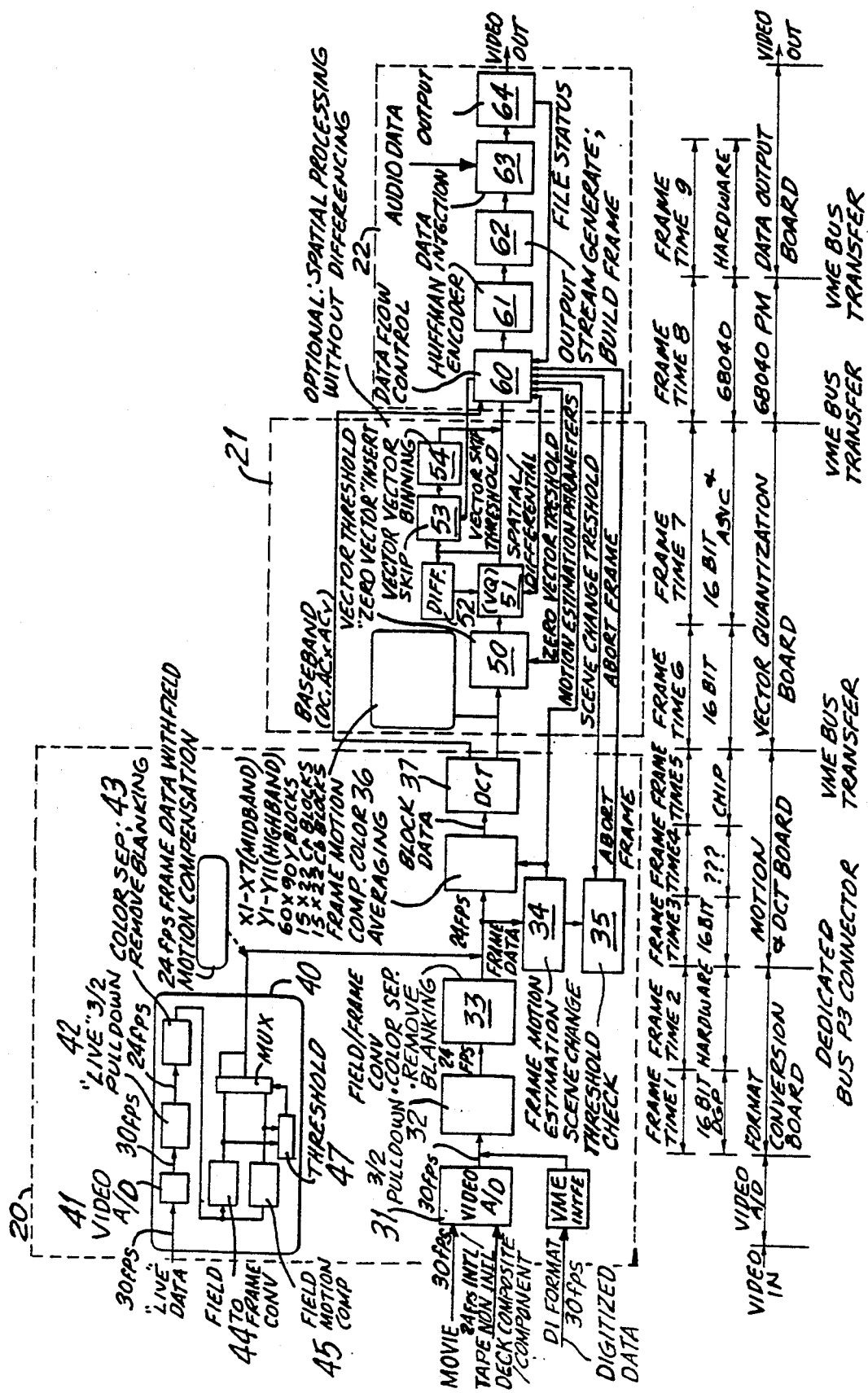
FIG. 3 is a detailed functional block diagram of the video encoder according to the present invention.

A more detailed version of the encoder is depicted in FIG. 3 which facilitates a more detailed description than the foregoing functional overview. The digitized data input accepts, via a standard VME interface 30, a CCIR 601 digital video signal and routes this to a 3-2 pulldown circuit 32. The digital video signal conforms to CCIR recommendation 656 for an eight bit data bus with a 27 MHz synchronous clock supplied by the data input. The video data is in a 30 frame-per-second (fps) format with a 4:2:2 sampling ratio for the luminance (Y), red-color-difference (Cr), and blue-color-difference (Cb) signals, respectively. Analog data from movies or tape, supplied at either 30 fps or 24 fps, is first digitized by a standard video analog-to-digital (A-D) converter 31 then fed to the 3-2 pulldown circuit 32.

The 3-2 pulldown circuit 32 converts received 30 fps video data to 24 fps by removing redundant fields created during the telecine process which converts a standard 24 fps film image into an image based on 30 fps transmission media. FIG. 4a schematically depicts the telecine process in which four frames of an original 24 fps movie with video fields labeled by "A" and "B", the fields for frame 1 identified as "A1" and "B1," are expanded into five frames by repeating a data field every two frames. The 3-2 pulldown process, shown in FIG. 4b, reverses the telecine process by identifying and removing the duplicated fields, restoring the four original frames.

The repeated frame is detected by subtracting adjacent data fields as they are input into the encoder. This subtraction is performed on a pixel by pixel basis, and the results are accumulated for the entire field. The difference for repeated fields will be zero within some margin due to noise and quantization error associated with the telecine and A/D processes. The 3-2 pulldown circuit examines the stream of field differences, and determines the minima, or nulls, that signify repeated fields of data. The circuitry will "lock on" at this point, removing periodic redundant fields from the flow. After acquiring lock on (or synch), the circuitry verifies that nulls occur at the proper points in the sequence. If nulls do not exist at these points, then synch has been lost and the "lock on" acquisition process is again implemented.

The 24 fps digital data stream output by the 3-2 pulldown circuit is in field oriented format, at 24 fps or 30 fps. Since subsequent encoding is based on full frame images, the data is formatted 33 by interleaving two video fields into one, non-interlaced video frame with all video blanking data removed. In addition, the Cr and Cb pixels are separated from the luminance (Y) data and physically stored in a separate memory. The Y data frame is composed of $720 \times 480$ pixels, while each of the Cr and Cb data frames are $360 \times 480$ pixels, consistent with the CCIR 4:2:2 format. In this form, the data is referred to as a compacted video frame.

After format conversion, frame motion estimation 34 is performed on the luminance (Y) data to approximate the relative motion between adjacent video data frames. The motion estimation processor 34 outputs a single value which indicates the X,Y (horizontal,vertical) offset of the current frame which best matches the previous frame, with a maximum compensation of $\pm 16$ pixels in each the horizontal (X) and the vertical (Y) dimensions, and with $\frac{1}{2}$ pixel resolution. This output is sent to frame motion compensation circuitry 36 and data flow control circuitry 60. The frame motion estimation processor 34 also transfers information to scene change threshold circuitry 35 which determines whether a scene change has occurred based on the correlation among the patch translations.

The motion compensation calculation is implemented in a binary search strategy to find the overall interframe translation. First, an array of pixel "patches", each patch comprised of a $16 \times 16$ pixel array, is superimposed on a succeeding frame and the absolute difference of each pixel is calculated and accumulated. The patches are then spatially shifted together 16 pixel locations in both the X and Y dimensions. The patches are again differenced from the superimposed frame image and this process of shifting and differencing is performed for each of the four possible directions ($+X +Y, +X -Y, -X +Y, -X -Y$). The best match of the five accumulations is used as the origin for another set of four calculations, using an eight pixel displacement. The process repeats for four and two pixel translations. When the one pixel translation is calculated, the four possible horizontal only and vertical only shifts are calculated in addition to the four diagonal shifts. One-half pixel resolution is achieved by creating a $\frac{1}{2}$ pixel resolution sub-image around the final search area of the patches and calculating the difference for a $\frac{1}{2}$ pixel shift in all eight possible shift positions. The $\frac{1}{2}$ pixel image is generated by spatially averaging the pixels in a patch in horizontal, vertical, and one diagonal dimension.

Upon receiving the frame motion estimation X,Y output, frame motion compensation circuitry 36 reframes both the luminance and chrominance data by moving the current data frame by the amount specified by the X,Y values. One-half pixel shifts are reframed by averaging pixel pairs in the horizontal, vertical, or diagonal dimensions, depending on the direction of the frame shift. "Bare edges", which occur at the edges opposite to the shift direction, are filled with data corresponding to the adjacent, original edge pixels. The resultant image of the reframing process becomes the reference frame for the motion estimation calculation on the subsequent frame.

Next, the Y, Cr, and Cb data are each grouped into $8 \times 8$ blocks using standard raster-to-block conversion circuitry. The resulting block order is in a block raster format, starting with the upper left corner of the video image. The Y output of the raster-to-block converter is fed directly to the discrete cosine transform (DCT) processor 37, whereas the Cr and Cb $8 \times 8$ block data are routed to color interpolation circuitry within functional block 36 in order to further reduce the data.

The color interpolation process reduces the chrominance data resolution by a factor of eight. FIG. 5 schematically illustrates the CCIR 601 pixel data format for a $4 \times 4$ pixel array, whereby the chrominance data is sampled at one-half the luminance rate in the horizontal dimension. In this practical embodiment, further reduction is achieved by averaging the chrominance data for each $4 \times 4$ pixel block. Thus, in FIG. 5, all eight Cr values are averaged resulting in one Cr value for the $4 \times 4$ pixel array. Similarly, the eight Cb values are separately averaged. This chrominance reduction is performed on each quadrant of each $8 \times 8$ block supplied by the raster-to-block converter for the separately stored original $360 \times 480$ Cr and Cb pixel images, resulting in a $180 \times 120$ chrominance pixel array for each chrominance component (Cr and Cb). These arrays are organized in $8 \times 8$ blocks and formatted into a block raster output for transfer to the DCT processor 37.

The DCT processor 37, a standard processor to those skilled in the art, converts an $8 \times 8$ spatial domain pixel block into an $8 \times 8$ transform coefficient array. The Y components of each image are first processed by the DCT processor 37, followed by the Cb and Cr components from the color interpolator.

The foregoing detailed functional description describes the video preprocessor 20 function for film and digitized data. Although the encoder circuitry may operate at 30 fps, data reduction to 24 fps is preferred; however, the previously described 3-2 pulldown circuit is not applicable to live video field images since the 30 fps rate is not the result of replicating fields of a 24 fps image—there are no explicitly redundant fields. Live video data, therefore, undergoes separate pre-processing 40.

After conventional video A/D conversion 41, the live digital video data enters a live 3-2 pulldown circuit 42 which manipulates two temporally displaced field images, forming a single frame from two correlated frames. A compact video frame is formed in functional step 43 in a similar manner as previously described functional step 33. Field-to-frame conversion 44 generates a frame format image which is one input to a multiplexer 46, the other input resulting from a field-to-frame converted image in which the fields are first motion compensated 45, a process not required for movie or tape video data. Threshold circuitry 47 accumulates the pixel-to-pixel difference between the field motion compensated frame and the uncompensated frame, and selects the compensated frame as the multiplexer output if the accumulated difference exceeds a predetermined value. The 24 fps multiplexer output is bussed to the previously described frame motion estimation 34 and compensation 36 circuitry, culminating with the DCT processor 37.

Although the DCT processor furnishes an $8 \times 8$ coefficient array corresponding to the input $8 \times 8$ spatial array, in the preferred embodiment only the first 21 (with respect to order of vertical and horizontal frequency) coefficients are used. The three baseband coefficients (DC, ACx, ACy) are passed directly to the data flow manager 22 for incorporation into the data stream for the frame data. Midband and highband vectors are formed by concatenating the next seven (X1-X7) and eleven (Y1-Y11) DCT coefficients, respectively, and are passed to the vector quantizer 21 for further processing.

Data entering the vector quantizer 21 first undergoes threshold based data reduction 50. Each incoming vector is compared to a threshold value which is set by the data flow controller 60 based on the output FIFO 64 occupancy. If the resultant difference is less than the threshold value, a zero vector value is inserted for that vector, and no further processing is performed for that particular vector. If the difference is not below threshold then the vector is processed according to either a spatial frame mode or a differential frame mode.

Both spatial and differential frame modes operate separately on midband and highband vectors supplied in block raster format and also operate separately on the luminance frame and chrominance frames (Cr and Cb). In the differential mode, a spatial frame is followed by a number of differential frames. A spatial frame corresponds to the direct coding of the vectors output by the DCT processor 37 while a differential frame corresponds to the coding of the difference between two temporally displaced frames. Separate codebooks (vector tables) are stored for midband and highband vectors for each mode.

Figure 6:
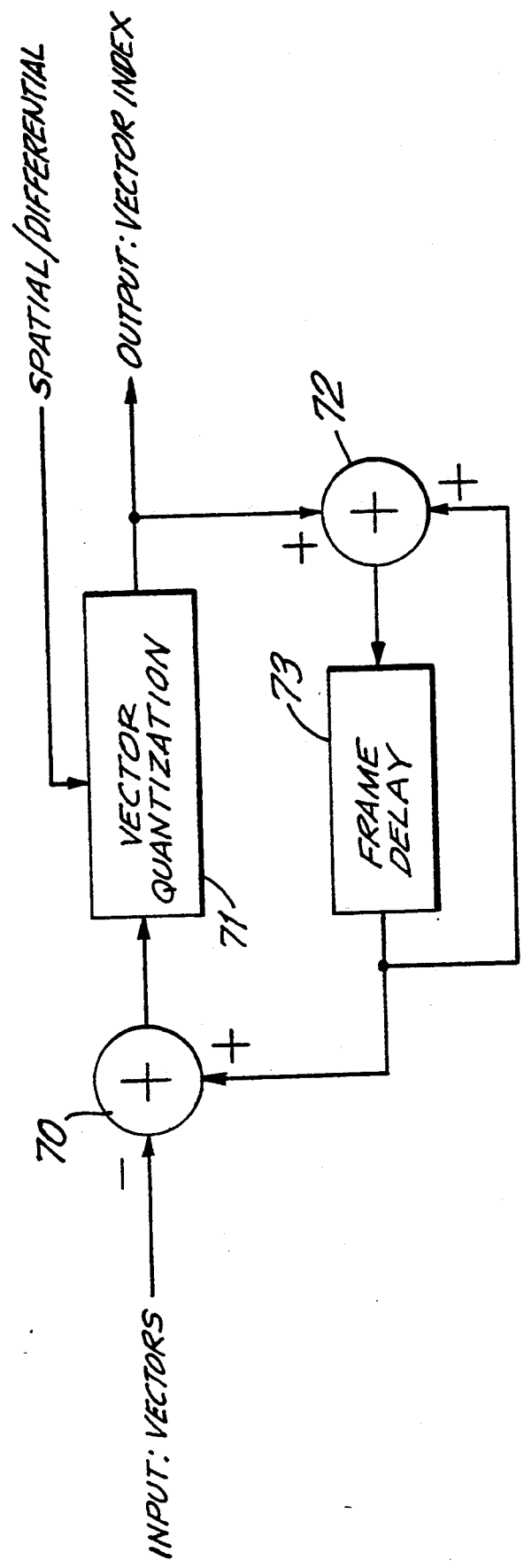
FIG. 6 shows the functional block diagram for the differential/spatial vector quantization processor according to the present invention.
Figure 7:
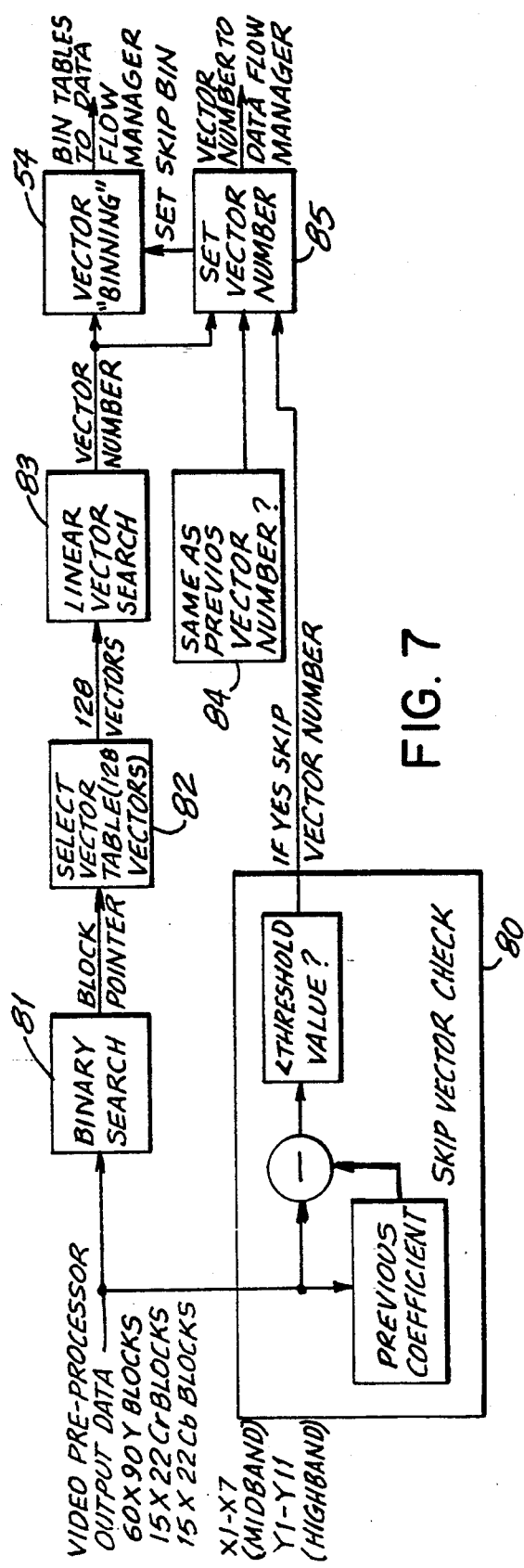
FIG. 7 is a functional block diagram of the vector skipping and vector binning operation according to the present invention.
Figure 8:
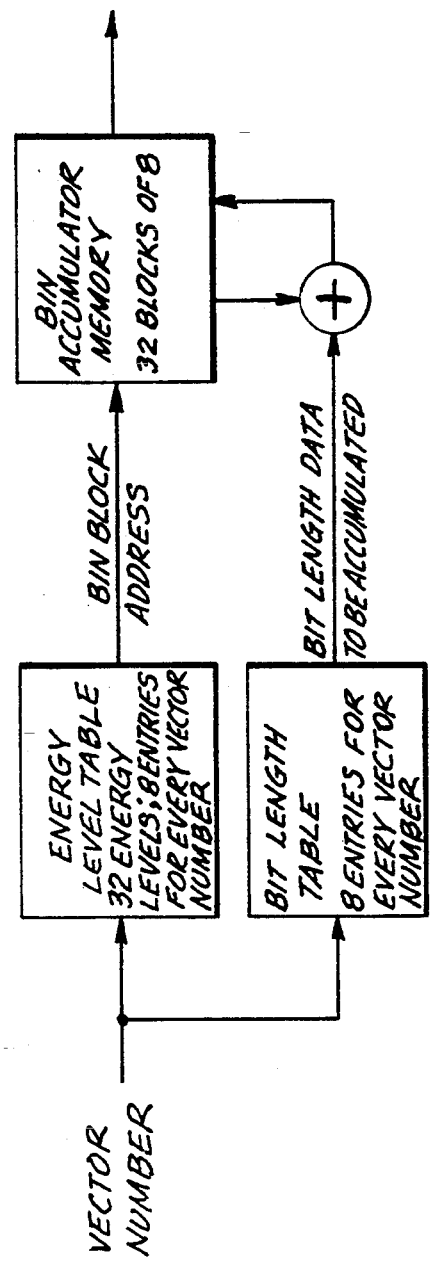
FIG. 8 details the vector binning operation according to the present invention.

Frame differencing occurs as part of the vector quantization unit 51 and differencing unit 52, and is schematically shown in FIG. 6. Vectors corresponding to the spatial frame pass through summing node 70 and are vector quantized 71 using a spatial VQ table resulting in the vector index output which is bussed to the data flow controller 60 and is passed through summing node 72 to frame delay unit 73. The frame delay unit 73 stores the VQ spatial frame image from which the subsequent frame image is subtracted on a vector-by-vector basis at summing node 70, the resulting difference image being vector quantized 71 using a separate differential vector table. The vector quantizer 71 outputs differential vector indices which are both bussed to the data controller 60 and fed to summing node 72 which adds the differential vector image corresponding to the differential vectors to the image previously stored in the frame delay unit 73, generating a new image which is stored in the frame delay unit 73 as the reference image for processing with subsequently input frames at node 70.

This differential frame process iterates until the next spatial frame occurs. The spatial/differential frame sequence occurs at a predetermined rate; however, scene changes may require resetting the spatial/differential sequence since a spatial frame may require less data than a differential frame when a frame pair has no temporal correlation. The data flow controller 60 monitors the scene change circuitry 35 output and resets the sequence by signaling vector quantizer unit 51. At the scene change, if the output FIFO space is limited a one frame hold at the scene change may be indicated by the data flow controller 60, allowing the FIFO time to unload the excess data associated with the scene change.

The second mode is a spatial mode corresponding strictly to the spatial frame coding previously described in the context of the differential mode. In addition to the threshold based data reduction 50, further data reduction is performed in accordance with FIG. 7. In this embodiment, vector quantization unit 51 contains skip vector check subcircuitry 80 which sets a skip vector number if the difference between temporally adjacent incoming vectors is within a data flow controller 60 determined threshold. If sequential incoming vectors differ according to the threshold in step 80 but possess the same vector number after the quantization process via steps 80-83, the skip vector number is also set in steps 84-85, which comprise vector skip unit 53 in FIG. 3. A vector "binning" operation 54 (FIG. 3 and FIG. 7) is also performed for each band for each frame and is detailed in FIG. 8. This binning operation quantifies the number and length of vectors residing in a certain energy band for the entire frame. This data is passed on to the data flow controller 60 along with the vector numbers, and is used in data reduction and flow control algorithms.

In both the spatial and differential modes, the vector quantization process 51 (FIG. 3) involves searching a vector table for the closest match to the incoming vector. The midband and highband vector searches use a two step process outlined in FIG. 7. First, a binary search 81 results in a pointer to a particular vector table which, in the preferred embodiment, contains 128 possible vectors. Next, a linear search is performed on these possible vectors, yielding the best match vector number as the output. In the preferred embodiment, the binary search process accumulates the product of each vector coefficient with a tabulated first entry and branches to one of two table locations depending on the polarity of the accumulated result. This process is repeated twelve times, resulting in a pointer to a table of 128 possible vectors which are linearly searched. The linear search strategy for the best match vector first calculates the difference between the coefficients in the input vector and the corresponding coefficients in the search vector table. The differences are squared then summed resulting in the mean squared error value for that comparison. Each vector in the search vector table is compared to the input vector and the minimum mean squared error determines the best match vector. The vector number for the closest vector match in the table is used in subsequent processing. The search process occurs within 64 pixel times for each 8×8 data block.

In the preferred embodiment, the forgoing binary/linear searching method is based on an off-line code table formation method. The off-line method organizes a set of reference training vectors according to a minimum distance clustering criterion which groups the vectors into a representative codeword set which spans the vector space. The on-line binary search is performed in accordance with the resulting Voronoi regions, each region containing 128 codewords which are searched linearly.

After the vector quantization processing 21, the encoded data is transferred to the data flow controller 60 of the data flow manager 22. The data flow controller 60 is based on a 68040 processor and, as has been described in conjunction with the video preprocessor 20 and vector quantization processor 21, controls the data flow within the encoder by monitoring the output FIFO 64 fill rate and occupancy. Based on these signals and scene change, motion estimation, and incoming vector binning signals, the data flow controller 60 adjusts the threshold signal to the vector threshold circuitry 50, adjusts the scene change threshold signal to circuitry 35, adjusts the vector skip threshold to circuitry 53, and/or restarts the spatial/differential sequence. In a specific control sequence, the data flow manager controls a vector energy threshold value in the spatial VQ process, increasing the threshold as the FIFO buffer approaches capacity. The spatial VQ process monitors the energy in the midband and highband portions of the DCT image. If the energy content is below the data flow management threshold value, the vector is nulled, reducing the data flow into the FIFO. If the output FIFO does saturate, however, the data flow manager will "hard limit" the data flow, preventing any data input into the FIFO until it is emptied to a predetermined level. In a preferred embodiment, the data flow controller may signal the related video system if an opportunity exists to insert alternative data into the output FIFO 64.

The output data stream from the data flow controller 60 is Huffman encoded 61, a variable length coding technique known to those skilled in the art. This data stream is then formatted into a communications frame by adding fields which may be later filled with sundry system information by the related video system. Included in this frame format construction is audio data injection 63. This data is then passed to the output FIFO 64 which outputs the video frame formatted data at a predetermined rate. In the preferred embodiment, the overall encoding process results in an output rate about 33 times smaller than the input video data, significantly improving the potential for digital video transmission.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope. For example, the circuit design of the functional circuit blocks may vary considerably. As an example of further refinement, decision circuitry may be included which bypasses the vector quantization unit if the energy is limited or confined to a number of coefficients. Additionally, the number of coefficients in each subband can be varied according to the video scene properties. For instance, high motion, detailed video scenes may require additional high frequency coefficients which may be traded off against the number of low frequency coefficients. Alternatively, less detailed, relatively still frames may require fewer high frequency coefficients. In addition to the previously described opportunistic data, data flow control can be designed to incorporate deterministic data at a predetermined rate with respect to the video frames.

These and other changes can be made without departing from the spirit and the scope of the invention and without diminishing its attendant advantages. It is therefore intended that the present invention is not limited to the disclosed embodiments but should be defined in accordance with the claims which follow.

I claim:

1. A method for data compression of a digital image signal whereby said image signal is subdivided into pixel blocks, each pixel represented by a predetermined number of bits, comprising the steps of:
   (a) generating the discrete cosine transform for said block, resulting in a corresponding block of transform coefficients;
   (b) scalar quantizing DC and one or more AC coefficients of said discrete cosine transform;
   (c) dividing remaining said AC coefficients which are not scalar quantized into a plurality of subband vectors according to their frequency components;
   (d) vector quantizing said subband vectors composed of subband coefficients resulting in a code for each said subband vector; and
   (e) repeating the above steps for each said block of said image signal.

2. The method according to claim 1, wherein a subset of said plurality of subbands is omitted from subsequent said vector quantization.

3. The method according to claim 1 wherein said vector quantizing comprises a plurality of codetables for each subband, including:
   (a) a differential codetable comprising codewords derived from inter-frame differences of transformed training image sequences; and
   (b) a spatial codetable comprising codewords derived from individual training image frames.

4. The method according to claim 1, wherein said vector quantizing of each subband vector includes separate codetable for each subband.

5. The method according to claim 4 wherein said codetable for each subband is prepared according to the steps of:
   (a) forming training vectors from coefficients derived from performing a discrete cosine transform on training images partitioned into pixel blocks, said coefficients grouped into training vectors according to said subband frequencies;
   (b) clustering training vectors into a set of representative codewords according to a minimum distance criterion which ensures spanning the vector space formed by said training vectors; and (c) forming said codetable by ordering said codewords in binary tree structure according to Voronoi regions.

6. A system for data compression of a digital image signal whereby said image signal is subdivided into pixel blocks, each pixel represented by a predetermined number of bits, comprising:

(a) a video preprocessor stage for receiving a plurality of individually selectable video input data, said preprocessor comprising individually selectable stages for formatting said input video data into separate digital luminance and chrominance data, said chrominance data reduced by averaging, said digital luminance and chrominance data assembled into pixel blocks which are transformed by a discrete cosine transformation processor which additionally forms subband vectors from transform coefficients of a particular frequency band and scalar quantizes coefficients corresponding DC and AC components;

(b) a vector quantization processor stage connected to output of said preprocessor stage for outputting a code corresponding to the result of a search for a minimum mean square error codeword with respect to a particular said subband vector; and (c) a data flow management stage connected to the output of said vector quantization processor further receiving said scalar quantized coefficients, comprising: a data flow control unit which monitors output data buffer and regulates data received from said vector quantization processor according to said output data buffer status; a Huffman encoder which receives said regulated data from said data flow control unit; a format control unit which formats received Huffman coded data; and said output buffer which receives formatted data and outputs said data at a predetermined rate.

7. The system according to claim 6, wherein said format control unit merges audio data with said data.

8. The system according to claim 6, further comprising means for signaling the availability of space in said data stream for interjecting opportunistic data.

9. The system according to claim 6, further comprising means for interjecting deterministic data into said data stream at a predetermined rate.

10. The system according to claim 6, further comprising circuitry associated with said vector quantization processor for skipping repeated input vectors or repeated vector codes.

11. The system according to claim 6, further comprising circuitry associated with said vector quantization processor for vector binning, said binning comprising tabulating the number of codes and code length within each of a plurality of frequency ranges within said subbands.

12. The system according to claim 6, wherein said vector quantization processor includes a plurality of vector quantizers for each subband.

13. The system according to claim 12, wherein said plurality of vector quantizers includes a differential codebook and a spatial codebook.

14. A system for data compression of a digital image signal whereby said image signal is subdivided into pixel blocks, each pixel represented by a predetermined number of bits, comprising:

(a) an input terminal for accepting a plurality of individually selectable video signals;

(b) a selectively operable digitizing stage connected to said input terminal for conversion of input analog video signals;

(c) a selectively operable pulldown stage connected to said digitizing stage for reducing the frame rate of said video signals by eliminating redundant fields or combining correlated fields;

(d) a frame formation stage connected to said pulldown stage comprising circuitry for removing video blanking data, separating color data, and generating a frame format video signal from a field oriented video signal;

(e) a frame motion estimation stage connected to output of said frame formation stage for generating an output signal corresponding to a relative motion between adjacent image frames;

(f) a scene change stage connected to said frame motion estimation stage for determining a change of scene event and generating a signal corresponding to occurrence of said event;

(g) a frame motion compensation stage connected to output of frame estimation stage for reframing luminance and chrominance data;

(h) a block forming circuit connected to said compensation stage for forming data blocks for luminance and chrominance data;

(i) a color averaging circuit connected to luminance block data output from block forming stage for reducing said chrominance data and outputting reduced chrominance data in block format;

(j) a transformation stage connected to output of said block forming circuit and color averaging circuit for generating discrete cosine transformation data for each received said block and grouping resulting transform coefficients into a plurality of subbands;

(k) a vector quantization stage connected to said transformation stage having an output code corresponding to a codeword which best matches input vector;

(l) a data flow control stage connected to output of said vector quantization stage and to output of said transformation stage, also monitoring an output data buffer, said data flow control stage regulating data flow into said output data buffer;

(m) a Huffman coding stage connected to output of said data flow control stage for data reduction prior to transfer to said output data buffer;

(n) a format control stage connected to output of said Huffman coding stage for organizing said data according to a predetermined format; and (o) said output data buffer connected to output of said format control stage for storing said data and outputting said data at a predetermined rate.

15. The system according to claim 14, wherein said format control stage merges audio data with said data.

16. The system according to claim 14, further comprising means for signaling the availability of space in said data stream for interjecting opportunistic data.

17. The system according to claim 14, further comprising means for interjecting deterministic data into said data stream at a predetermined rate.

18. The system according to claim 14, further comprising circuitry associated with said vector quantization stage for skipping repeated input vectors or repeated vector codes.

19. The system according to claim 14, further comprising circuitry associated with said vector quantization stage for vector binning, said binning comprising tabulating the number of codes and code length within each of plurality of frequency ranges within said subbands.

20. The system according to claim 14, wherein said vector quantization stage includes a plurality of vector quantizers for each subband.

21. The system according to claim 20, wherein said plurality of vector quantizers includes a differential codebook and a spatial codebook.

* * * * *